United States Patent
Bratkovski et al.

(10) Patent No.: US 7,763,973 B1
(45) Date of Patent: Jul. 27, 2010

(54) INTEGRATED HEAT SINK FOR A MICROCHIP

(75) Inventors: Alex Bratkovski, Palo Alto, CA (US);
Shih-Yuan Wang, Palo Alto, CA (US);
Chandrakant Patel, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 11/784,463

(22) Filed: Apr. 5, 2007

(51) Int. Cl.
*H01L 23/48* (2006.01)
*H01L 23/46* (2006.01)
*H01L 23/34* (2006.01)

(52) U.S. Cl. .................. 257/714; 257/E23.051; 257/E23.097; 257/E23.098; 257/E25.013; 257/717; 257/712; 257/713; 257/720; 257/685; 257/686; 257/777; 257/723; 257/706

(58) Field of Classification Search ........... 257/714, 257/712, 713, 720, 717, 686, 723, 777, 706, 257/E23.051, E23.097, E23.098, E25.013, 257/685
See application file for complete search history.

(56) References Cited

U.S. PATENT DOCUMENTS

| | | | |
|---|---|---|---|
| 4,254,431 A * | 3/1981 | Babuka et al. ............... 257/713 |
| 4,573,067 A | 2/1986 | Tuckerman et al. |
| 4,868,712 A | 9/1989 | Woodman |
| 5,200,631 A | 4/1993 | Austin et al. |
| 5,262,351 A | 11/1993 | Bureau et al. |
| 6,128,188 A | 10/2000 | Hanners |
| 6,552,901 B2 | 4/2003 | Hildebrandt |
| 6,591,898 B1 * | 7/2003 | Chu et al. .................. 165/80.4 |
| 6,994,151 B2 * | 2/2006 | Zhou et al. ................. 165/80.4 |
| 7,061,104 B2 * | 6/2006 | Kenny et al. ................ 257/714 |
| 7,078,803 B2 * | 7/2006 | Tilton et al. ................. 257/714 |
| 7,112,885 B2 | 9/2006 | Chen et al. |
| 7,139,172 B2 | 11/2006 | Bezama et al. |
| 7,230,334 B2 * | 6/2007 | Andry et al. ................ 257/713 |
| 2004/0130874 A1 * | 7/2004 | Maveety et al. ............ 361/699 |
| 2005/0104027 A1 * | 5/2005 | Lazarev ...................... 252/62 |
| 2006/0002087 A1 * | 1/2006 | Bezama et al. ............. 361/699 |
| 2006/0125092 A1 * | 6/2006 | Marshall ..................... 257/723 |
| 2006/0142401 A1 * | 6/2006 | Tonkovich et al. ......... 518/726 |
| 2006/0278901 A1 * | 12/2006 | Dangelo et al. ............ 257/276 |
| 2008/0042261 A1 * | 2/2008 | Wolter et al. ................ 257/706 |
| 2008/0315403 A1 * | 12/2008 | Andry et al. ................ 257/713 |
| 2009/0102046 A1 * | 4/2009 | Dimitrakopoulos et al. . 257/712 |

OTHER PUBLICATIONS

Nanoengineered Heat Sink Materials; Ames Technology Capabilites and Facilities; NASA; http://www.nasa.gov/centers/ames/research/technology-onepagers/heat_sink.html; taken from cite Feb. 9, 2007.
Carbon Nanotube Heatsinks by Fujitsu; CDRinfo The Hardware Authority; Dec. 6, 2005; http://www.cdrinfo.com/Sections/News/Details.aspx:NewsId=15746; taken from cite Feb. 9, 2007.
Hua Huang, et al.; Aligned Carbon Nanotube Composite Films for Thermal Management; Advanced Materials; 2005, 17, pp. 1652-1656.

* cited by examiner

*Primary Examiner*—Alexander O Williams

(57) ABSTRACT

In an embodiment, an integrated heat sink for a microchip includes a substrate having a plurality of interconnected electronic devices formed in a plurality of layers. At least one heat sink element is interposed within the layers and includes a microchannel to provide a fluid flow path for heat transfer. Other embodiments include a method of making an integrated heat sink for a microchip.

14 Claims, 6 Drawing Sheets

INTEGRATED HEAT SINK FOR A MICROCHIP

BACKGROUND

Microcircuits typically include a number of semiconductor devices which generate heat during operation. As microcircuit geometries become increasingly smaller, the heat density increases. Heat output of devices is also increased as devices operate at higher clock frequencies. Operation of semiconductor devices can be degraded at high temperatures, and thus it is desirable to remove this heat from the microcircuit. With the trend to smaller and faster devices, heat removal has become more difficult.

Heat removal is typically provided by attaching the microcircuit to a heat sink. For example, the electronic devices in the microcircuit are typically constructed on one side of a substrate and the back side of the substrate is attached to a heat sink. While heat removal using such an approach is possible, the heat must flow through the substrate, limiting the effectiveness of cooling.

Increasingly complex microcircuit structures are being used which further complicates heat removal. One example is microcircuits which include fabrication on both sides of a silicon waver. Another example is three-dimensional circuits which are implemented by chip stacking or multi-chip modules. As yet another example, optical interconnect layers may be placed on top of active circuitry layers to augment or replace conventional metal interconnect. With these complex structures, electronic devices can generate heat deep within a structure which it is difficult to remove.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

DETAILED DESCRIPTION OF EXAMPLE EMBODIMENTS

In describing embodiments of the present invention, the following terminology will be used.

The singular forms "a," "an," and "the" include plural referents unless the context clearly dictates otherwise. Thus, for example, reference to "a component surface" includes reference to one or more of such surfaces.

As used herein, the term "about" means that dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art.

Reference will now be made to the exemplary embodiments illustrated, and specific language will be used herein to describe the same. It will nevertheless be understood that no limitation of the scope of the invention is thereby intended.

In view of the difficulties presented by complex microcircuit arrangements, it has been recognized by the present inventors that improved techniques for removing heat from microcircuits are desirable. Accordingly, embodiments of the present invention include integrated heat sinks that can be fabricated as part of the microchip. Furthermore, microchannels can be included within the heat sink to allow for cooling fluid flow through the heat sink. This can allow improved removal of heat from complex structures.

Figure 1:
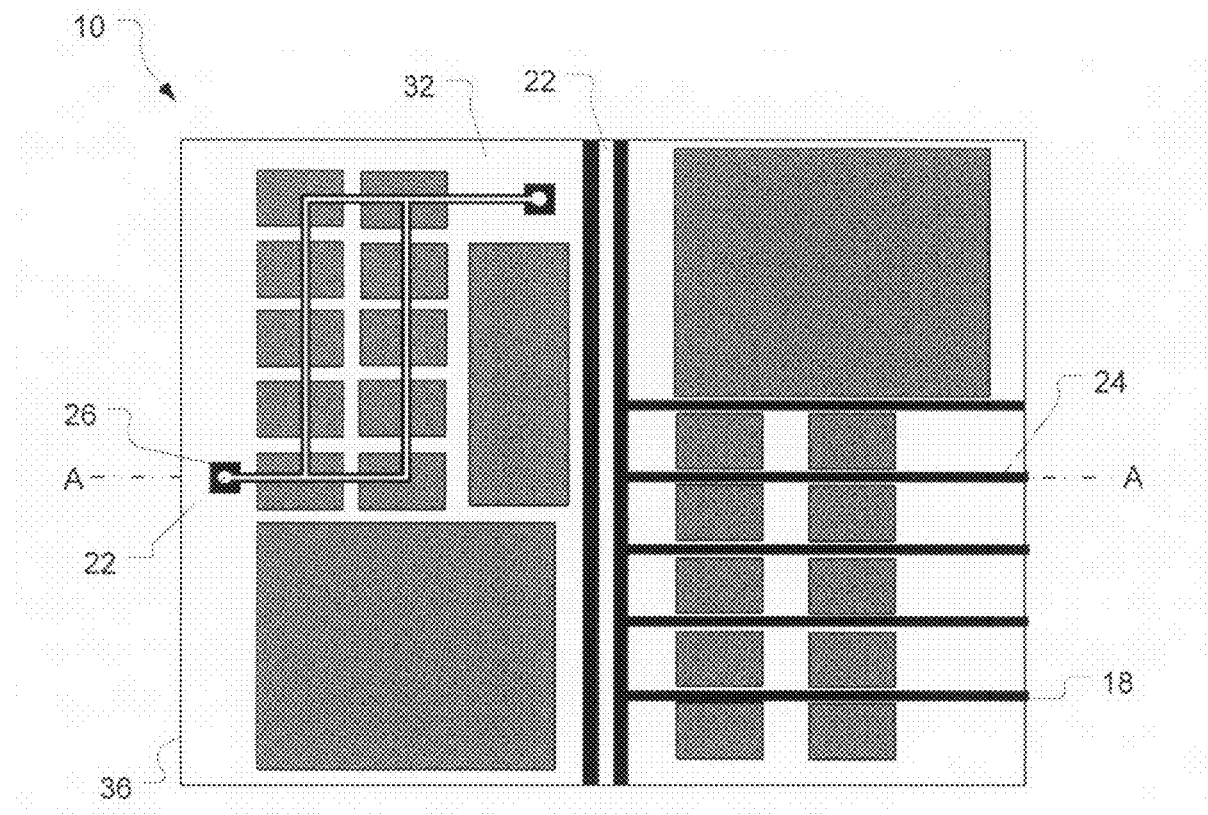
FIG. 1 is a top view illustration of a microchip having an integrated heat sink in accordance with an embodiment of the present invention.
Figure 2:
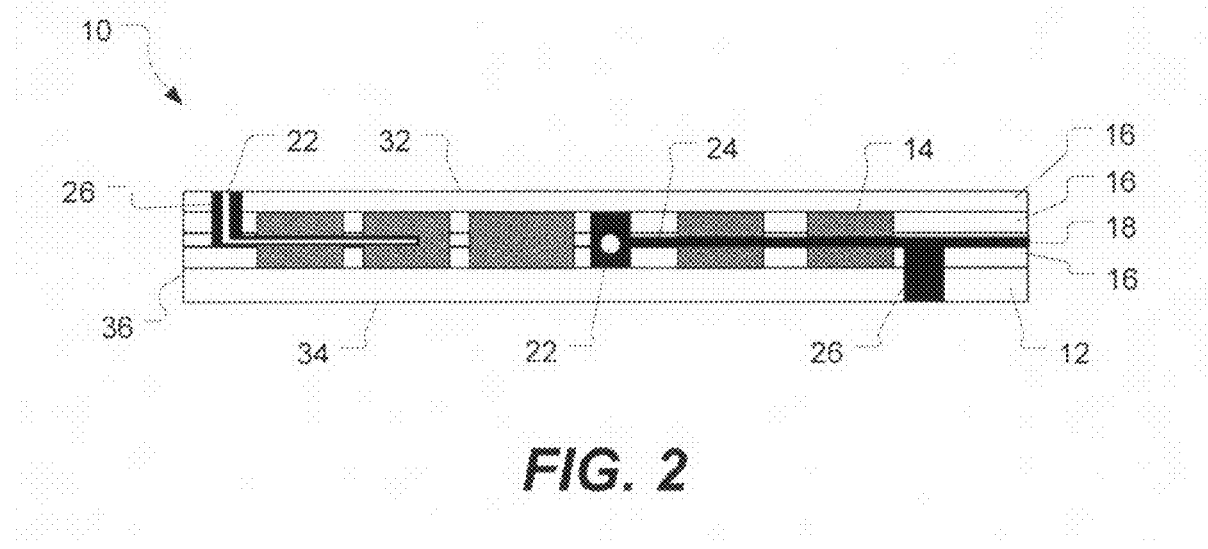
FIG. 2 is a side cross section view illustration of the microchip of FIG. 1 taken along line A-A.

One exemplary embodiment of the present invention is an integrated heat sink for a microchip as illustrated in side view in FIG. 1 and top view in FIG. 2. The microchip, shown generally at 10, includes a substrate 12 on which a plurality of interconnected electronic devices 14 are formed. For example, interconnected electronic devices may include active devices such as CMOS transistors and the like. The electronic devices may be formed in layers 16, for example, including doped regions, insulating regions (e.g., gate insulators, etc.), conducting regions (e.g., gates, terminals, interconnect, etc.).

Included within the microchip is at least one means for conducting heat from the electronic devices towards an exterior surface of the microchip, for example, a heat sink element 18. The heat sink element can be interposed within the layers. Included within the heat sink element is a means for flowing a heat transfer fluid through at least a portion of the means for conducting heat. For example, the means for flowing a heat transfer fluid can be one or more microchannels 22 configured to provide a fluid flow path within the heat sink element. Fluid can be flowed through the microchannel to enhance transfer of heat through the heat sink element.

The heat sink element 18 can extend between the layers, for example, having portions fabricated between active device layers and interconnect layers. The heat sink element 18 can include horizontally-oriented strips 24, vertically-oriented plugs 26, and combinations thereof. The heat sink element helps to conduct heat away from the active devices towards an exterior surface of the microchip, such as a top surface 32, bottom surface 34, or side surface 36. For example, horizontally-oriented strips can help to move heat toward the side surface or toward vertically-oriented plugs, and vertically-oriented plugs can help to move heat toward the top surface, bottom surface, or toward horizontally-oriented strips. In general, the heat sink element can be configured to provide desired heat flow paths from the heat sources (electronic devices) towards heat dissipating areas (surfaces of the microchip). For example, vertically-oriented plugs may be used to help conduct heat towards a front or back surface of the microchip which can be placed in thermal contact to an external heat sink. As another example, vertically-oriented plugs may be used to help conduct heat through a microchip which is part of a stack of wafer-bonded microchips in a three-dimensional integrated circuit. While a variety of configurations is shown in FIG. 1 and FIG. 2, it will be appreciated that not all of these configurations need be used in a particular microcircuit.

It will be appreciated that placing the heat sink element into the layers with the electronic devices places the heat sink in close proximity to the heat sources, helping to provide effective heat transfer away from the electronic devices. Moreover, for devices generating a large amount of heat, cooling fluid can be directed close to the device through the microchannels embedded within the heat sink element, further enhancing heat transfer.

Figure 3:
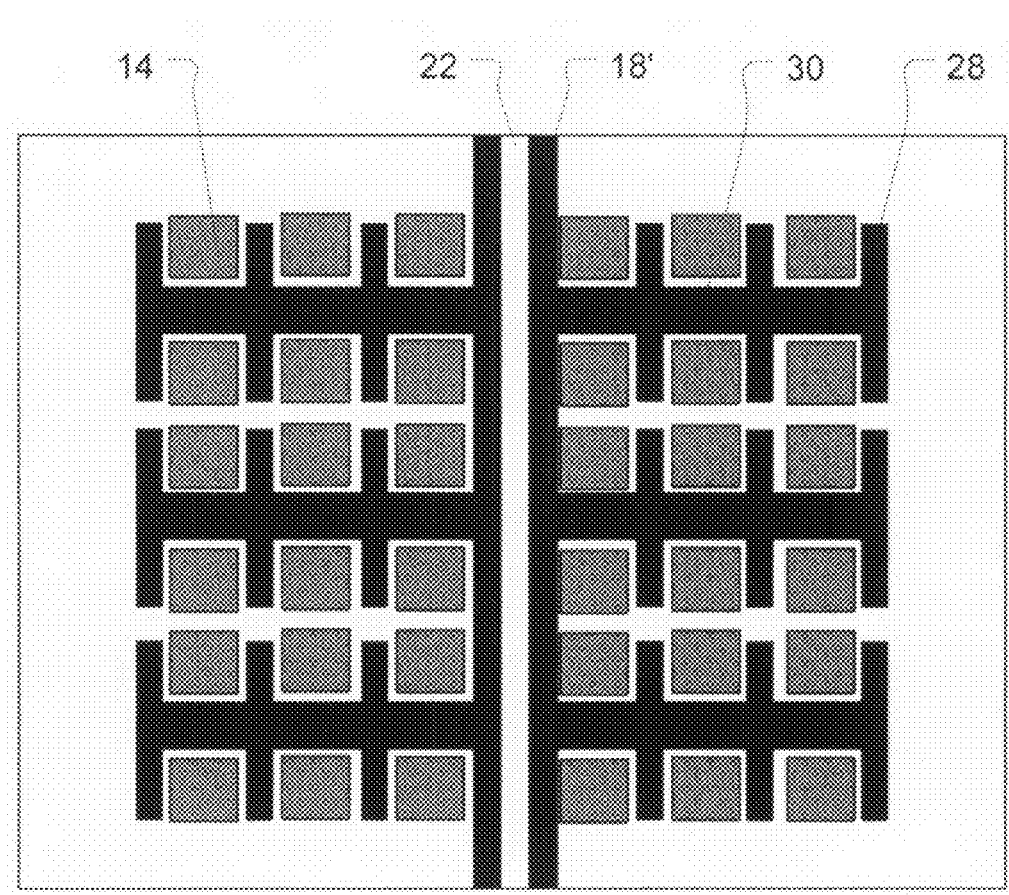
FIG. 3 is top view illustration of a microchip having an integrated heat sink in a dendritic configuration in accordance with an embodiment of the present invention.

A heat sink element 18' can be arranged in a dendritic (tree) structure as illustrated in top view in FIG. 3 in accordance with an another embodiment of the present invention. Smaller branches 28 can extend between electronic devices 14, and join together into larger branches 30 which extend toward the exterior surface of the microcircuit. A microchannel 22 can extend through the largest branch or branches of the dendritic structure. The sizes of the branches can be designed to customize heat flow capability. For example, larger branches can be used in microcircuit areas generating increased heat and smaller branches can be used in microcircuit areas generating less heat.

Various sizes of branches can be used within the dendritic structure. For example, the smallest branches may be about 10 to 100 nanometers in width, and feed into slightly larger branches of about 100 to 1000 nanometers in width, which feed into larger branches of about 10,000 nanometers, etc.

Figure 4:
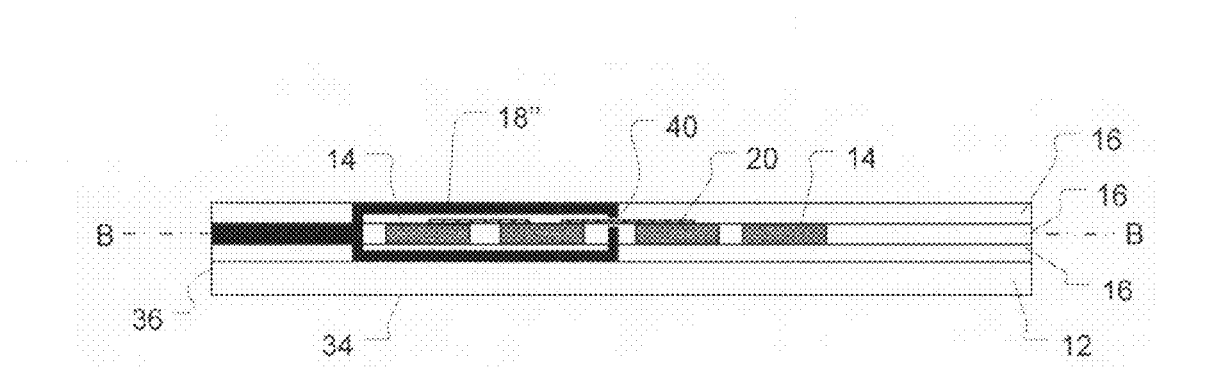
FIG. 4 is a side cross section view illustration of a microchip having an integrated heat sink substantially enclosing at least one electronic device in accordance with an embodiment of the present invention.
Figure 5:
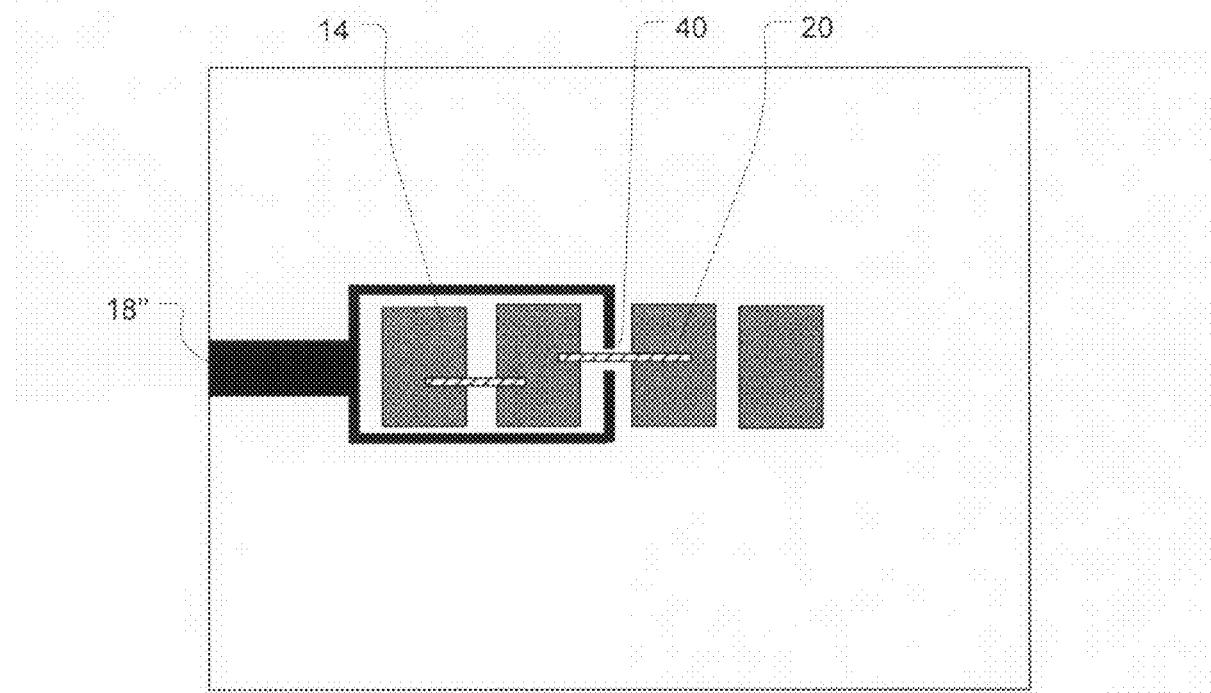
FIG. 5 is a top cross section view illustration of the microchip of FIG. 4 taken along line B-B of FIG. 4.

As another example, a heat sink element 18" can substantially enclose one or more of the electronic devices 14, for example as illustrated in accordance with an embodiment of the invention in FIGS. 4 and 5. The heat sink element surrounds the device(s), enabling heat to be collected from all sides of the device and conducted away. The devices need not be completely enclosed, in that vias or holes 40 in the heat sink element can be included to allow electrical interconnects 20 to the device to pass through the heat sink element to interconnect to other electronic devices.

Figure 6:
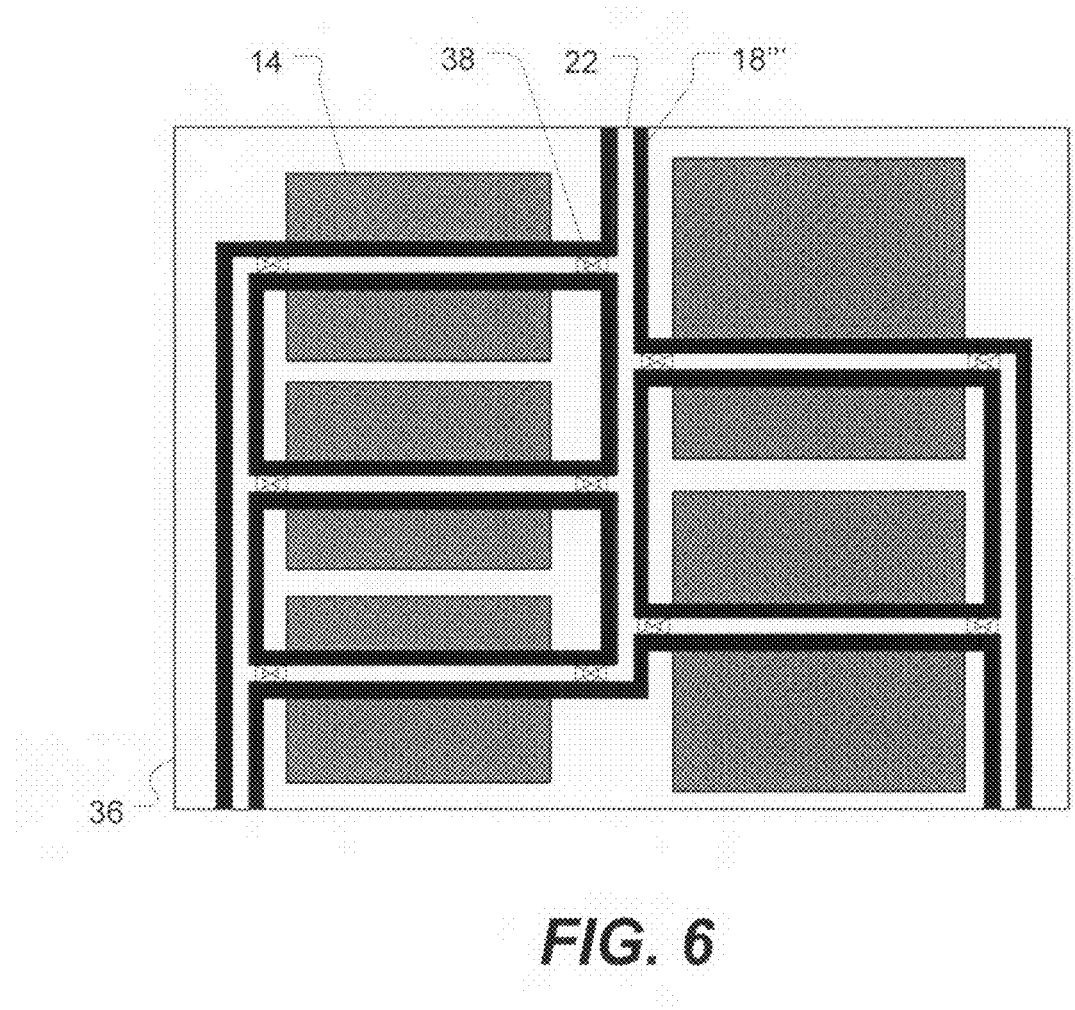
FIG. 6 is a top cross section view illustration of a microchip having an integrated heat sink with a plurality of microchannels and valves in accordance with an embodiment of the present invention.

A heat sink element 18''' can include a plurality of interconnected microchannels 22, for example as illustrated in top view in FIG. 6. The microchannels can include means for controlling the flow of fluid through at least a portion of the microchannel, for example, a valve 38. Various valve types can be used, including for example, micro-electro mechanical valves. Opening and closing of the valve may be controlled electronically (e.g., under control of the electronic devices 14) or automatically (e.g., temperature activated). For example, a bimetal valve using two strips of dissimilar metals with differing rates of expansion can be designed to open or close based at a desired temperature.

The inclusion of valves 38 can allow the flow of cooling fluid through the heat sink element 18" to be varied in response to required cooling needs. Various fluids may be used for cooling, including for example air, gasses (e.g., helium), water, fluorocarbon fluids, emulsions, liquid metals (e.g. mercury, gallium, alloys), and the like.

For example, in a microprocessor, the heat generation from different areas of the electronic devices 14 may vary depending on the tasks being performed by the microprocessor. Thus, the heat sink may include means for adaptively directing cooling fluid flow towards portions of the microchip generating larger amounts of heat. Fluid flow through an area may be enabled by opening associated valves to allow flow through the area when heat is being generated, and the fluid flow disabled when less heat is being generated. For example, the microchip can include a network of thermal sensors associated with the valves, so that valves are opened and closed to direct coolant to specific areas of the microchip needing cooling. As another example, valves may be opened or closed based on criteria such as the activity level within certain portions of the microchip. Such "smart" cooling can provide for increased effectiveness of the heat sink.

Various materials can be used for the construction of the integrated heat sink. For example, heat sink material can include metals (e.g., aluminum, copper), poly diamond, carbon nanotubes, silicon nanowires, diamond nanowires, and the like. For example, carbon nanotubes are excellent heat conductors, providing higher thermal conductivity than metals. Accordingly, portions of or the entire heat sink element may be fabricated with carbon nanotubes or carbon nanotube carrying material. Alignment of the carbon nanotubes is not essential, since even randomly oriented carbon nanotubes can help to provide a material with high thermal conductivity.

Figure 7:
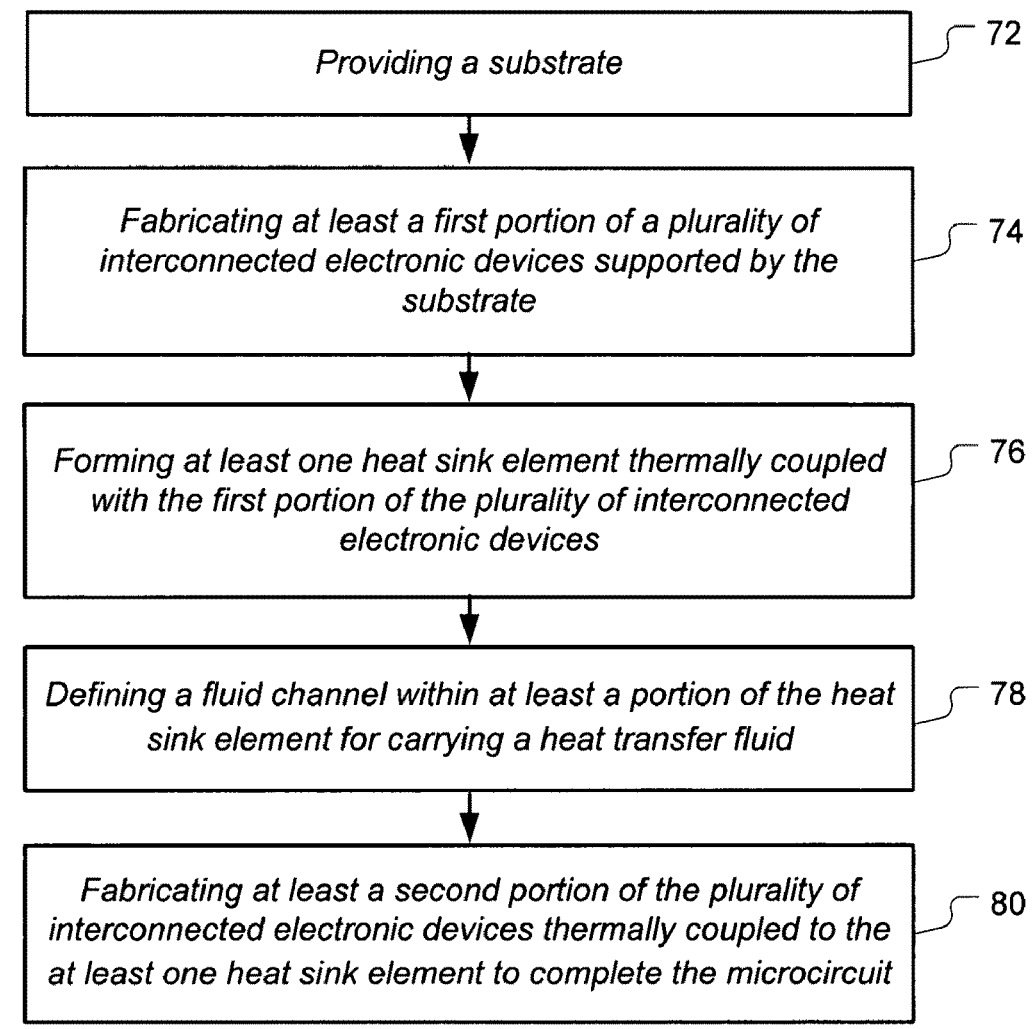
FIG. 7 is a flow chart of a method of making an integrated heat sink for a microchip in accordance with an embodiment of the present invention.

A method of making an integrated heat sink for a microchip is illustrated in flow chart form in FIG. 7 and will be described in conjunction with FIG. 8a-FIG. 8d. The method 70 can include providing 72 a substrate. For example, the substrate 82 may be a semiconductor material, such as silicon, gallium arsenide, or the like. The substrate may also be an insulator, such as sapphire.

Figure 8A:
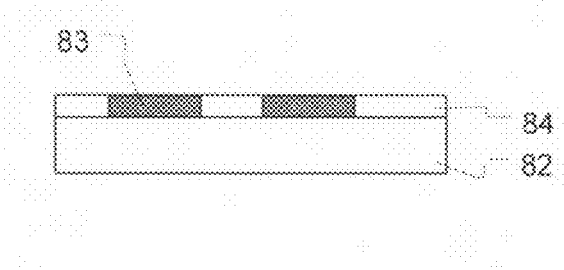
FIG. 8a-FIG. 8d are cross section illustrations showing various states of fabrication of an integrated heat sink for a microchip in accordance with embodiments of the present invention.

The method 70 can include fabricating 74 at least a first portion 83 of a plurality of interconnected electronic devices supported by the substrate. For example, fabricating at least a first portion of the interconnected electronic devices may include steps such as ion implantation, oxide layer formation, electrode formation, interconnect formation, and the like to form a first layer 84 on the substrate 82 as shown in FIG. 8a.

Figure 8B:
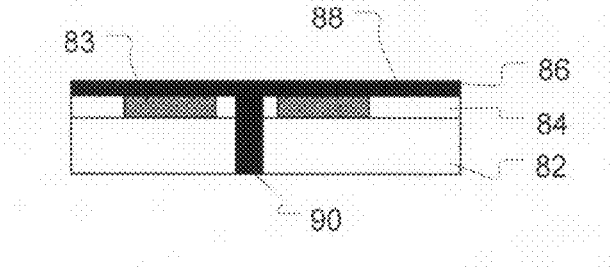

The method 70 can also include forming 76 at least one heat sink element 86 thermally coupled with the plurality of interconnected electronic devices. For example, the heat sink element may include portions which extend horizontally 88 across the first layer 84 as shown in FIG. 8b. The heat sink element may include portions which extend vertically 90, for example, through the substrate. Forming the at least one heat sink element can include depositing a heat sink material and patterning the heat sink element using various techniques, including for example, photolithography. For example, a layer of heat sink material can be deposited over the first layer, a photoresist layer applied and exposed through a mask, exposed (positive photoresist) or unexposed (negative photoresist) portions of the mask washed away by a developer solution, and the exposed portions of the heat sink material removed using etching or other processing. Etching can be performed, for example, by wet etching or dry etching, such as reactive ion etch (RIE). Alternately, lithography can be performed using a lift off process, where materials are deposited over a developed mask, and then the mask is removed, causing material in masked portions to be removed along with the mask. Liftoff can be advantageous when deposited materials are difficult to etch or otherwise remove. Multiple layers of materials may be deposited and lifted off in a single step.

Heat sink material can be deposed using a process that grows, coats, or otherwise transfers a material onto the wafer. For example, depositing can be performed by spin coating, physical vapor deposition (PVD), chemical vapor deposition (CVD), electrochemical deposition (ECD), molecular beam epitaxy (MBE), atomic layer deposition (ALD), and similar processes.

Figure 8C:
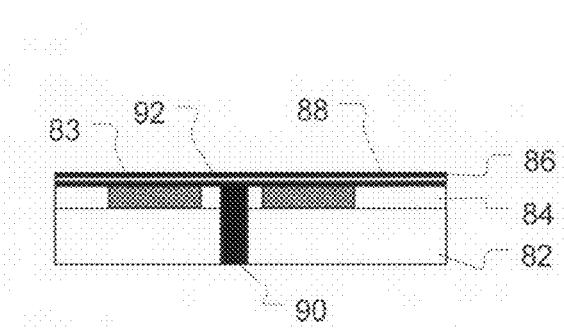

The method 70 can also include defining 78 a fluid channel 92 within at least a portion of the heat sink element 86 for carrying a heat transfer fluid. For example, the fluid channel may be defined by etching the channel into the heat sink element as shown in FIG. 8c. For example, the heat sink element may be built up using multiple steps of deposition and patterning, where an etchable material is deposited to define the channel and then removed in a later processing step.

Figure 8D:
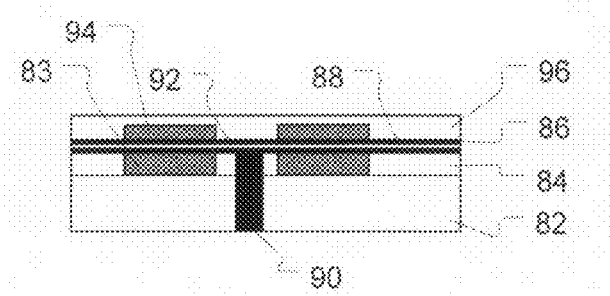

The method 70 can also include fabricating 80 at least a second portion 94 of the plurality of interconnected electronic devices thermal coupled to the at least one heat sink element to complete the microcircuit. For example, fabricating at least a second portion of the interconnected electronic devices may include steps such as oxide layer formation, gate electrode formation, interconnect formation, and the like to form a second layer 96 on the substrate 82 as shown in FIG. 8d.

It will be appreciated that various orders of forming individual portions of the electronic devices and portions of the heat sink can be used. For example, forming the at least one heat sink element may be performed simultaneously with fabricating portions of the electronic devices. As another example, forming the at least one heat sink element may be performed in several steps, with some portions of the heat sink element formed before the electronic devices are fabricated and other portions of the heat sink element formed after the electronic devices are completed.

As an example, the heat sink element may be formed between layers having active portions (e.g., emitters, collectors, gates, etc.) of the electronic devices and layers having interconnection traces to provide improved heat removal. Placing the heat sink closer to the source of heat can help to improve the effectiveness of heat removal. In contrast, in conventional microcircuits, the active portions of the electronic devices are typically covered by a dielectric layer, and metal interconnect traces placed on top of the dielectric layer. Multiple alternating layers of metal and dielectric can be built up to provide multiple interconnect layers, as some microcircuits include 2, 3, or more interconnect layers. A passivation layer is typically placed over the final interconnect layer. Although a heat sink can be placed on top of the passivation layer, the multiple layers of dielectric and interconnect metal inhibit heat flow from the electronic devices to the heat sink. Embodiments of the present invention can include interleaving the heat sink with the electronic devices, placing portions of the heat sink under, over, beside, or even inside the electronic devices.

As another example, portions of the interconnected electronic devices may be fabricated on different substrates. For example, first portions may be fabricated on a first substrate, and second portions fabricated on a second substrate, and the two substrates bonded together to complete the microcircuit. As a particular example, the first portions may include silicon based electronic devices (e.g., CMOS), and the second portions may include indium phosphide based electro-optical devices used for interconnect.

Valves can be formed within the fluid channel if desired, for example, using micromachining fabrication techniques.

Summarizing and reiterating to some extent, an integrated heat sink in accordance with embodiments of the present invention can provide improved smart heat removal from a microcircuit. For example, the heat sink can be integrated into the layers that form the electronic devices of the microcircuit, allowing for close proximity of portions of the heat sink to the electronic devices. This close proximity can allow for improved heat flow from the electronic devices to the heat sink, helping to increase heat removal effectiveness. The heat sink can include complex geometries, allowing the heat sink to provide a heat conducting path that extends from difficult to access interior portions of the device out to one or more surfaces of the substrate.

Fluid flow through microchannels within the heat sink can help to further increase the effectiveness of heat removal. The heat sink and microchannels can be designed and fabricated to match expected heat output of the devices. Valves can be included in the microchannels to allow adjustment of fluid flow during operation. For example, when heat production varies, fluid flow can be varied in a compensating manner, providing more flow to areas generating increased heat and reducing flow to areas generating less heat.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An integrated heat sink for a microchip, comprising:
a substrate having a plurality of interconnected active electronic devices disposed thereon, each active electronic device comprising a plurality of layers;
at least one heat sink element interposed within the layers; and
a microchannel disposed within the at least one heat sink element configured to provide a fluid flow path for heat transfer.

2. The integrated heat sink of claim 1, wherein the at least one heat sink element comprises a plurality of branches arranged in a dendritic structure.

3. The integrated heat sink of claim 2, wherein the microchannel is disposed within a largest branch of the dendritic structure.

4. The integrated heat sink of claim 1, further comprising a plurality of interconnected microchannels disposed within the at least one heat sink element.

5. The integrated heat sink of claim 4, further comprising at least one valve interposed between two of the microchannels.

6. The integrated heat sink of claim 5, wherein the valve is a micro-electro-mechanical valve.

7. The integrated heat sink of claim 5, wherein the valve is automatically temperature-activated.

8. The integrated heat sink of claim 1, wherein the at least one heat sink element comprises at least one horizontally-oriented strip.

9. The integrated heat sink of claim 1, wherein the at least one heat sink element comprises at least one vertically-oriented plug.

10. The integrated heat sink of claim 1, wherein the at least one heat sink element comprises a carbon nanotube.

11. The integrated heat sink of claim 1, wherein at least one of the interconnected electronic devices is substantially enclosed by a portion of the heat sink element.

12. An integrated heat sink for a microchip, comprising:
a substrate having a plurality of interconnected active electronic devices disposed thereon, each active electronic device comprising a plurality of layers;
a plurality of means for conducting heat from the electronic devices toward an exterior surface of the microchip, the means for conducting heat being at least partially interposed within the layers; and a means for flowing a heat transfer fluid through at least a portion of the means for conducting heat.

13. The integrated heat sink of claim 12, further comprising a means for controlling the flow of fluid through at least a portion of the means for flowing a fluid.

14. The integrated heat sink of claim 12, further comprising a means for adaptively directing the flow of fluid through portions of the means for conducting heat associated with portions of the microchip generating high heat.

* * * * *